US009406367B2

(12) United States Patent
Chih et al.

(10) Patent No.: US 9,406,367 B2
(45) Date of Patent: Aug. 2, 2016

(54) METHOD AND APPARATUS FOR MRAM SENSE REFERENCE TRIMMING

(71) Applicant: TAIWAN SEMICONDUCTOR MANUFACTURING CO., LTD., Hsin-Chu (TW)

(72) Inventors: Yue-Der Chih, Hsin-Chu (TW); Kai-Chun Lin, Hsinchu (TW); Hung-Chang Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/868,425

(22) Filed: Sep. 29, 2015

(65) Prior Publication Data

US 2016/0019943 A1    Jan. 21, 2016

Related U.S. Application Data

(62) Division of application No. 13/804,773, filed on Mar. 14, 2013, now Pat. No. 9,165,629.

(60) Provisional application No. 61/777,170, filed on Mar. 12, 2013.

(51) Int. Cl.
    *G11C 11/00*     (2006.01)
    *G11C 11/16*     (2006.01)
    (Continued)

(52) U.S. Cl.
    CPC .............. *G11C 11/1673* (2013.01); *G11C 7/14* (2013.01); *G11C 11/1675* (2013.01); *G11C 29/021* (2013.01); *G11C 29/028* (2013.01)

(58) Field of Classification Search
    USPC .................................... 365/158, 189.09, 148
    See application file for complete search history.

(56) References Cited

U.S. PATENT DOCUMENTS

| 7,813,166 B2 | 10/2010 | Jung et al. |
| 2006/0028871 A1 | 2/2006 | Suzuki |

(Continued)

FOREIGN PATENT DOCUMENTS

| JP | 2003085968 A | 3/2003 |
| JP | 2011527066 A | 10/2011 |

(Continued)

OTHER PUBLICATIONS

Official Action issued Sep. 24, 2014 in counterpart KR patent application No. 10-2013-0076872.

(Continued)

*Primary Examiner* — Vu Le
(74) *Attorney, Agent, or Firm* — Duane Morris LLP

(57) ABSTRACT

A trimming process for setting a reference current used in operating an MRAM module comprising an operational MRAM cell coupled to a bit line, multiple reference MRAM cells coupled to a reference bit line, and a sense amplifier coupled to the bit line and the reference bit line is disclosed in some embodiments. The process includes applying a bit line reference voltage to the reference bit line to provide a reference cell current formed by a sum of respective currents through the plurality of reference MRAM cells. The reference cell current is detected. A determination is made as to whether the detected reference cell current differs from a target reference cell current. The bit line reference voltage is varied, or a sensing ratio of the sense amplifier is varied, if it is determined that the detected reference cell current differs from the target reference cell current.

20 Claims, 9 Drawing Sheets

(51) Int. Cl.
*G11C 7/14* (2006.01)
*G11C 29/02* (2006.01)

(56) References Cited

U.S. PATENT DOCUMENTS

| | | | |
|---|---|---|---|
| 2006/0028889 A1* | 2/2006 | Liaw | G11C 7/062 365/209 |
| 2009/0125787 A1 | 5/2009 | Sakimura et al. | |
| 2011/0157971 A1 | 6/2011 | Kim et al. | |
| 2011/0289386 A1 | 11/2011 | Yang | |

FOREIGN PATENT DOCUMENTS

| | | |
|---|---|---|
| KR | 10-2005-0051668 | 6/2005 |
| KR | 10-2011-0078181 | 7/2011 |

OTHER PUBLICATIONS

Kim, J.P. et al.,"A 45m, 1Mb embedded STT-MRAM with design techniques to minimize read-disturbance", 2011 Symposium on FLSI Circuits (VLSIC), Jun. 2011, pp. 296-297.

Official Action issued Feb. 10, 2015 in counterpart JP patent application No. 2014-047480.

* cited by examiner

METHOD AND APPARATUS FOR MRAM SENSE REFERENCE TRIMMING

CROSS-REFERENCE TO RELATED APPLICATION

This application is a division of co-pending U.S. application Ser. No. 13/804,773 entitled "Method and Apparatus for MRAM Sense Reference Trimming" filed Mar. 14, 2013, which claims priority to U.S. Provisional Patent Application No. 61/777,170, filed Mar. 12, 2013, the entireties of which are incorporated by reference herein.

BACKGROUND

Magneto-resistive random access memory (MRAM) is a non-volatile random access memory technology that uses magnetic storage elements to store data. MRAM stores data at memory cells having two superimposed layers of magnetic material separated by a thin insulating film, defining a magnetic tunnel junction ("MTJ" or "MTJ element") of an MRAM cell. The two layers include a magnetic layer that is permanently magnetized in a fixed magnetic field alignment direction (this layer is referred to as a pinned layer), and a changeably-magnetized magnetic layer (this layer is referred to as a free layer). The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance and the anti-parallel alignment state has a higher resistance.

The two states of an MRAM cell are sensed from their relatively higher or lower resistances ($R_H$ and $R_L$), which represent different binary logic values of a bit stored in the memory. A reference voltage is applied to the MRAM cell, and the resulting cell current can be used to determine whether the cell is in the low resistance state or the high resistance state. For this purpose, a sense amplifier is typically used to compare the cell current against a reference current.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1A:
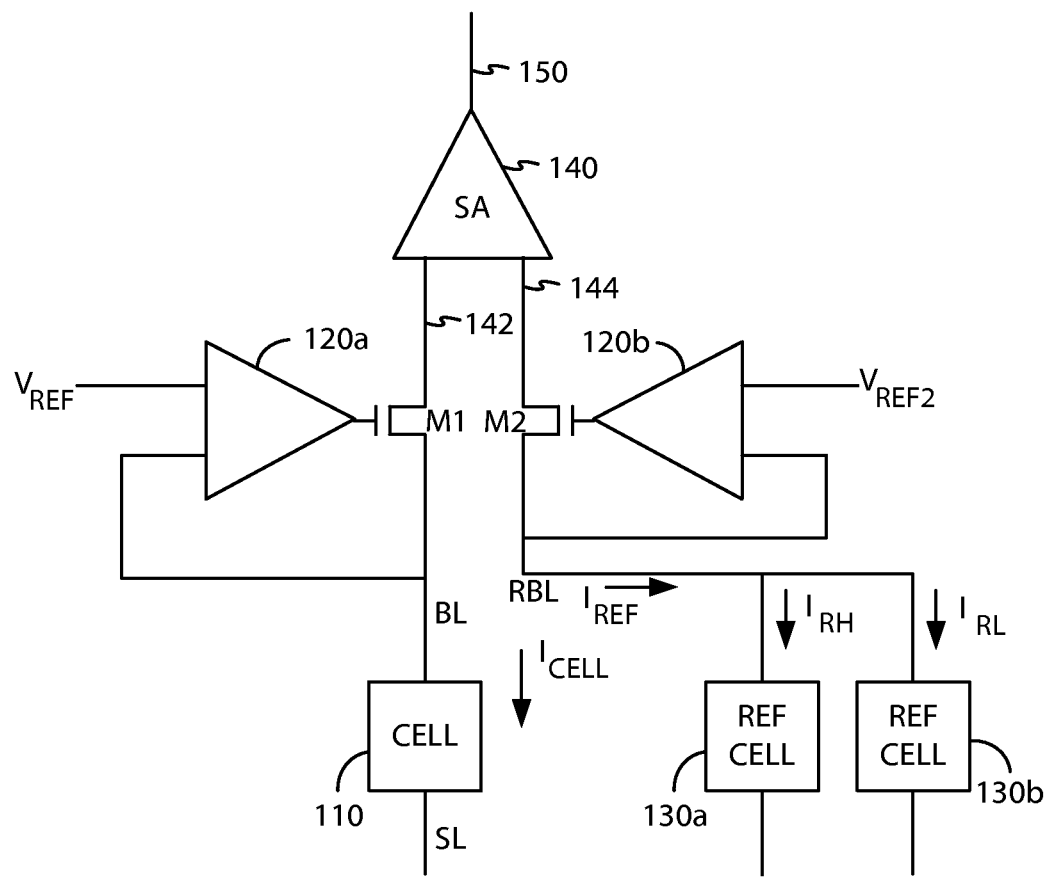
FIG. 1A is a circuit diagram in accordance with some embodiments of the present disclosure.

FIG. 1A is a circuit diagram in accordance with some embodiments of the present disclosure. An MRAM cell 110 is coupled between a bit line BL and a supply line SL. Cell 110 includes a magnetic tunnel junction (MTJ) which can be in one of two states (corresponding to high resistance $R_H$ or low resistance $R_L$), such that cell 110 stores one bit of data. To sense the state of cell 110, a first reference voltage $V_{REF}$ is applied as shown in FIG. 1A. An amplifier 120 receiving $V_{REF}$ at one input terminal is provided in a feedback configuration as shown with BL coupled to another input terminal. Amplifier 120 drives an NMOS transistor M1 coupled to BL. Due to the applied reference voltage $V_{REF}$, a cell current $I_{CELL}$ flows through cell 110. $I_{CELL}$ is compared against a reference current $I_{REF}$, which is generated based on a pair of reference memory cells 130a, 130b (a reference pair 130) coupled to a reference bit line RBL. The resistance of reference pair 130 may be called $R_{PAIR}$. The reference cells 130a, 130b are used to provide a reference current. In contrast, cell 110 may be called an operational cell because it is used to store a bit as part of the MRAM. One cell in the reference pair (e.g., reference cell 130a) is set to $R_H$, and the other (e.g., reference cell 130b) is set to $R_L$. A second reference voltage $V_{REF2}$ is applied to each cell in the reference pair using amplifier 120b which is provided in a feedback configuration to drive NMOS transistor M2 as shown in FIG. 1A. As a result, reference currents $I_{RH}$ and $I_{RL}$ flow through reference cells 130a, 130b having the high and low resistances, respectively, and their sum (i.e., $I_{REF}$) is compared against $I_{CELL}$. Sense amplifier 140, which may be a mirror-type comparator, receives inputs 142 and 144 and generates a sense result 150 which indicates the state of the MRAM cell 110.

Due to process variation, the resistances of reference cells 130a and 130b may vary when those cells are set to the high and low resistance states, respectively. As a result, $I_{REF}$ may vary away from a target level. In some embodiments, $V_{REF2}$ is trimmed (i.e., adjusted) during a testing phase (for testing the MRAM system) to compensate for such fluctuation in $I_{REF}$. The reference current $I_{REF}$ follows Ohm's law: $I_{REF}=V_{REF2}/R_{PAIR}$. Thus, if $R_{PAIR}$ is detected to be lower than expected (e.g., due to process variation), $V_{REF2}$ may be trimmed (adjusted) higher as compensation, thus adjusting the voltage at RBL. As a result, a reliable reference current is established, increasing reliability of the sense amplifier's output (sense result 150).

Sense amplifier 140 may be one of several sense amplifiers, with each sense amplifier associated with a respective input/ output (I/O) device, and with each sense amplifier having its own reference current $I_{REF}$. In some embodiments, $V_{REF2}$ may be trimmed to tune the sensing reference current globally, e.g., using a switch to connect the $V_{REF2}$ lines associated with respective I/O devices. Alternatively, $V_{REF2}$ may be trimmed to tune the sensing reference current on a per-I/O-device basis.

In some embodiments, rather than trimming reference voltage $V_{REF2}$ (and thus adjusting the voltage at RBL), a sensing ratio is varied to compensate for fluctuation in $I_{REF}$. For example, suppose target values for I_RL and I_RH are 10 μA and 30 μA, respectively. Then the target reference current level may be halfway between 10 μA and 30 μA (i.e., at 20 μA) so that a cell current $I_{CELL}$ can be determined as being higher or lower than this target reference current level. The sensing ratio may ordinarily be 2:1, so that a weighting factor of ½ is applied to input 144 of sense amplifier 140 (i.e., $I_{REF}$, which is the sum of I_RH and I_RL, is divided by 2). Due to process variation, the resistance of reference pair 130 may vary from its expected value, such that $I_{REF}$ becomes 50 μA instead of the nominal value of 40 μA in this example. If the sensing ratio of 2:1 were continued to be used, the reference current level of 50/2=25 μA would be too close to 30 82 A (rather than being halfway between 10 μA and 30 μA), which would skew and degrade the reliability of sense result 150. To compensate for the changed resistance of reference pair 130, the sensing ratio may be changed, e.g. by setting it at 5:2 instead of 2:1. The ratio between the detected reference cell current and the target reference cell current is M:1 where M=5/4=1.25, and multiplying the old sensing ratio (2/1) by 1.25 yields 2.5/1 (i.e., 5:2). With the sensing ratio of 5:2, $I_{REF}$ is weighted by 2/5 to yield a level of 20 μA again, ensuring proper sense functionality. The sensing ratio may be adjusted globally (i.e., for all sense amplifiers) or on a per-I/O-device basis (i.e., only for sense amplifiers associated with particular I/O devices).

Figure 1B:
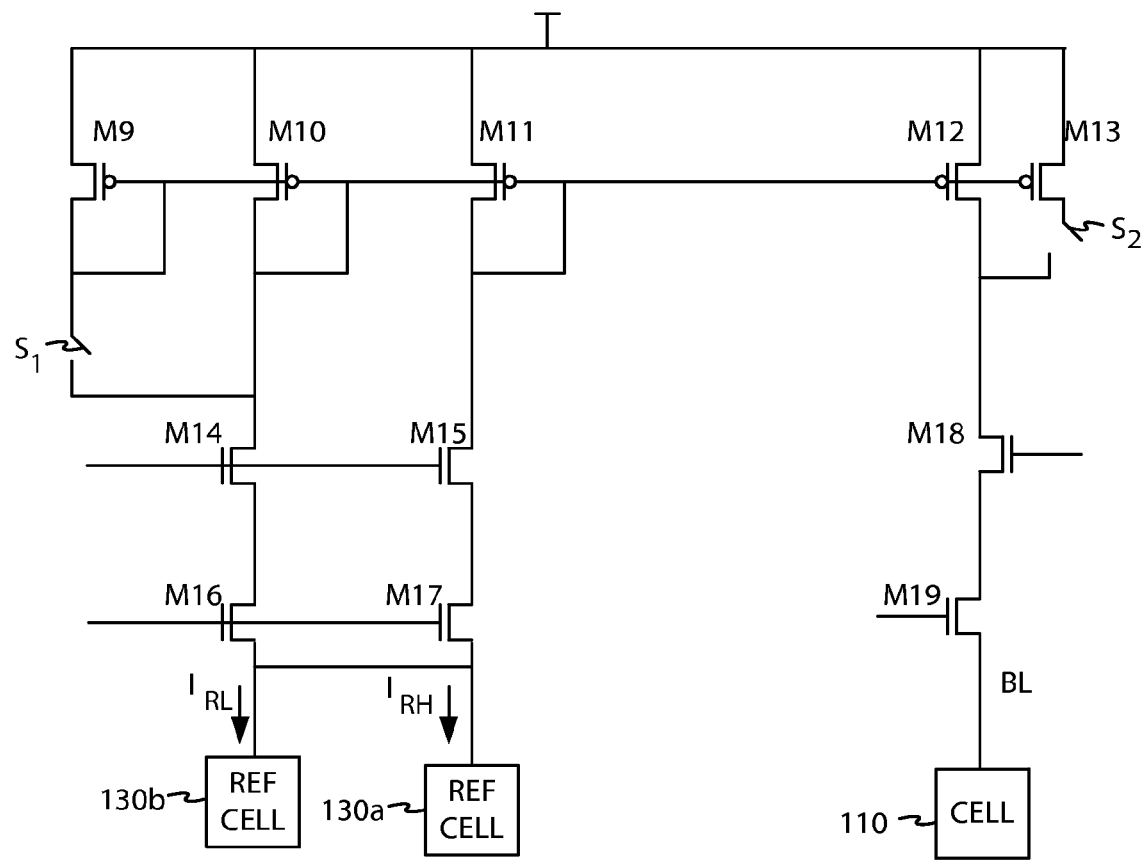
FIG. 1B is a circuit diagram showing a technique for changing a sensing ratio in accordance with some embodiments.

An example of how the sensing ratio may be changed is shown in FIG. 1B. Switches S1 and S2 determine whether optional PMOS transistors M9 and M13 are used. Various numbers of such PMOS transistors may be used to adjust the respective currents in various ways.

By adding one of these transistors (when the appropriate switch is closed), current is increased. The widths of the respective transistors M9, M10, M11, M12, M13 determine the magnitude of the current conducted between source and drain terminals of each transistor. For example, transistors M9, M10, M11, M12 and M13 may have widths that enable a current $I_{base}$ to flow between source and drain terminals of each of M10, M11, and M12, and that enable a current $0.1*I_{base}$ to flow between source and drain terminals of each of the optional PMOS transistors M9, M13. Thus, M9 and M13 provide fine control of the sensing ratio, depending on whether switches S1 and/or S2 are closed. For example, if switches S1 and S2 are both open, a nominal sensing ratio of $(2*I_{base})/(I_{base})=2:1$ is achieved. If switches S1 and S2 are both closed, the sensing ratio is adjusted to $(2.1*I_{base})/(1.1*I_{base})=2.1/1.1$. Different numbers of optional PMOS resistors (like M9 and M13) that are switchably selected or different widths for those transistors may be used to provide various options for controlling the sensing ratio to a desired resolution. If the same transistor size (width) is used for each of transistors M9, M10, M11, M12 and M13, then closing switches S1 and S2 yields a sensing ratio of 3:2. Because the optional PMOS transistors can be any size, any combination of numerator and denominator, and thus any sensing ratio, is achievable.

NMOS transistors M14, M15, and M18 are used for clamping the bit line voltage. For example, of 0.8 V is applied on each of transistors M14, M15, and M18, the voltage at bit line BL may be approximately 0.8 V- $V_t$, where $V_t$ is the turn-on voltage of these transistors, and this bit line voltage may change based on different voltage or current conditions. Transistors M16, M17, and M19 are used for selecting one of various bit lines. For example, 32 bit lines (or any other number of bit lines) may be used, and by asserting the signals at the gates of M16, M17, and M19 one of the bit lines is selected.

Thus, in various embodiments, either the bit line reference voltage (voltage at RBL) or sensing ratio of sense amplifier 140 may be varied to compensate for a reference cell current that differs from a target reference cell current.

Figure 2A:
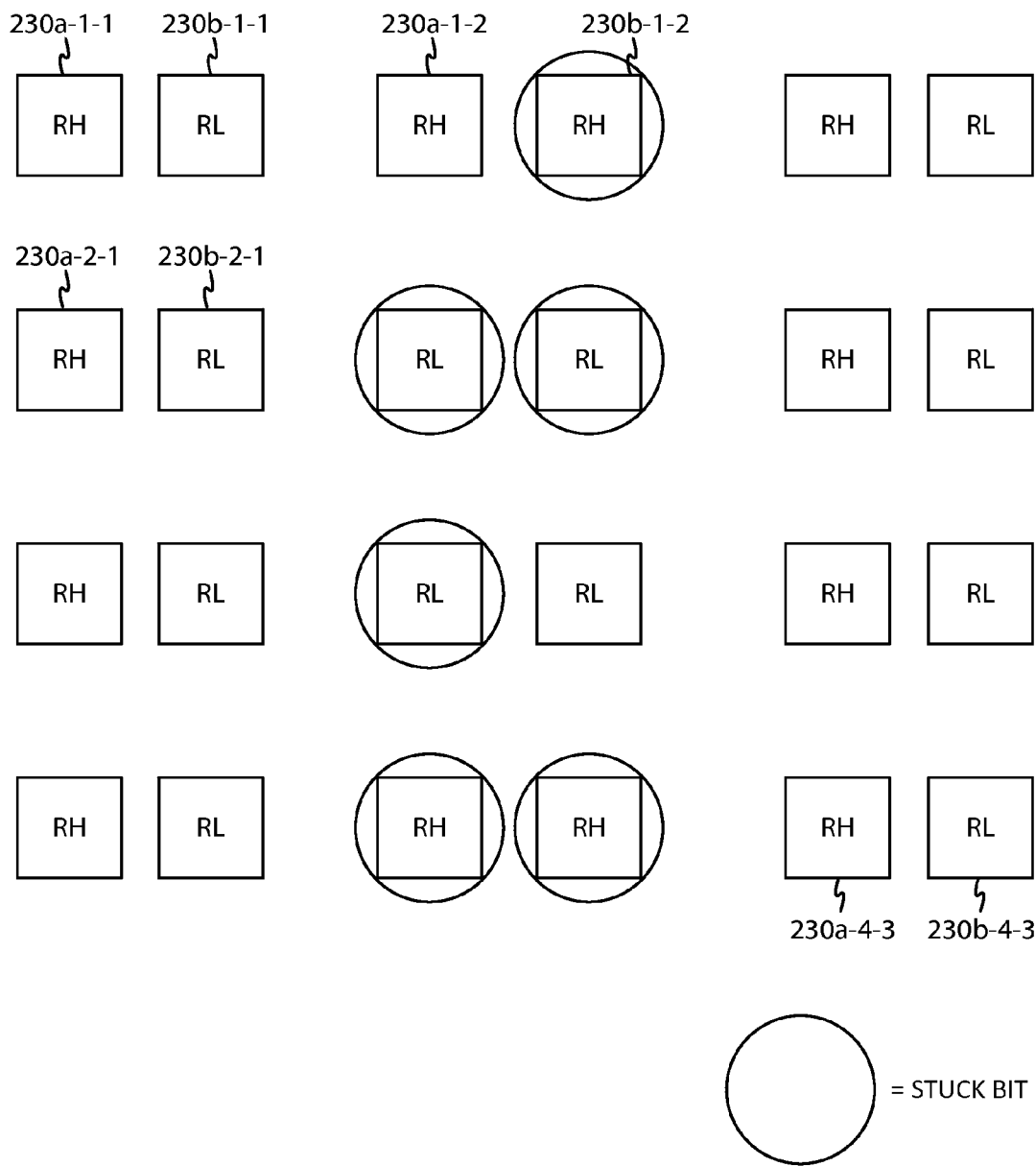
FIG. 2A is an illustration of pairs of reference cells in a row-column arrangement, with some reference cells stuck at a particular state.

FIG. 2A is an illustration of pairs of reference cells in a row-column arrangement, with some reference cells stuck at a particular state Twelve pairs of reference cells (twelve reference pairs) are shown in FIG. 2A. Each reference pair is denoted with a suffix of the form "-i-j" where "i" is the row index and "j" is the column index for an MRAM having multiple cells arranged in an array of rows and columns. In each reference pair, one cell is denoted with an "a" and the other is denoted with a "b". Thus, the reference pair at the top left of FIG. 2A includes reference cells 230a-1-1 and 230b-1-1, and the reference pair at the bottom right includes reference cells 230a-4-3 and 230b-4-3. Any number of rows and columns may be used. Each reference pair is used to provide a reference current for comparison with a cell current of a corresponding MRAM cell in the array. Ideally, as described above regarding FIG. 1A, in each reference pair one reference cell is set to $R_H$ and the other reference cell is set to $R_L$. The first and third columns in FIG. 2A show such a situation where reference cells conform with predetermined assigned states. Thus, according to a predetermined pattern, a first state (e.g., $R_H$) is assigned to a first positional one of the cells in each pair (e.g., the cell shown on the left in each pair in column 1 of FIG. 2A), and a second state is assigned to a second positional one of the cells in each pair (e.g., the cell shown in the right in each pair in column 1).

Sometimes, due to process weakness, for example, some of the reference cells may be "stuck" bits or may be written to the wrong state. For example, in FIG. 2A, stuck bits are circled. Thus, instead of the desired $R_H$-$R_L$ pairs, the reference pairs in the second column are (from the first row to the fourth row): $R_H$-$R_H$ (because reference cell 230b-1-2 is stuck in the $R_H$ state, and thus cannot be written to $R_L$), $R_L$-$R_L$ (because both reference cells 230a-2-2 and 230b-2-2 are stuck in the $R_L$ state), $R_L$-$R_L$, and $R_H$-$R_H$, respectively. As a result, merging the cells in these reference pairs would not ordinarily yield the correct (target) reference current level, because two cells of a single state would be merged rather than two cells of distinct states.

Figure 2B:
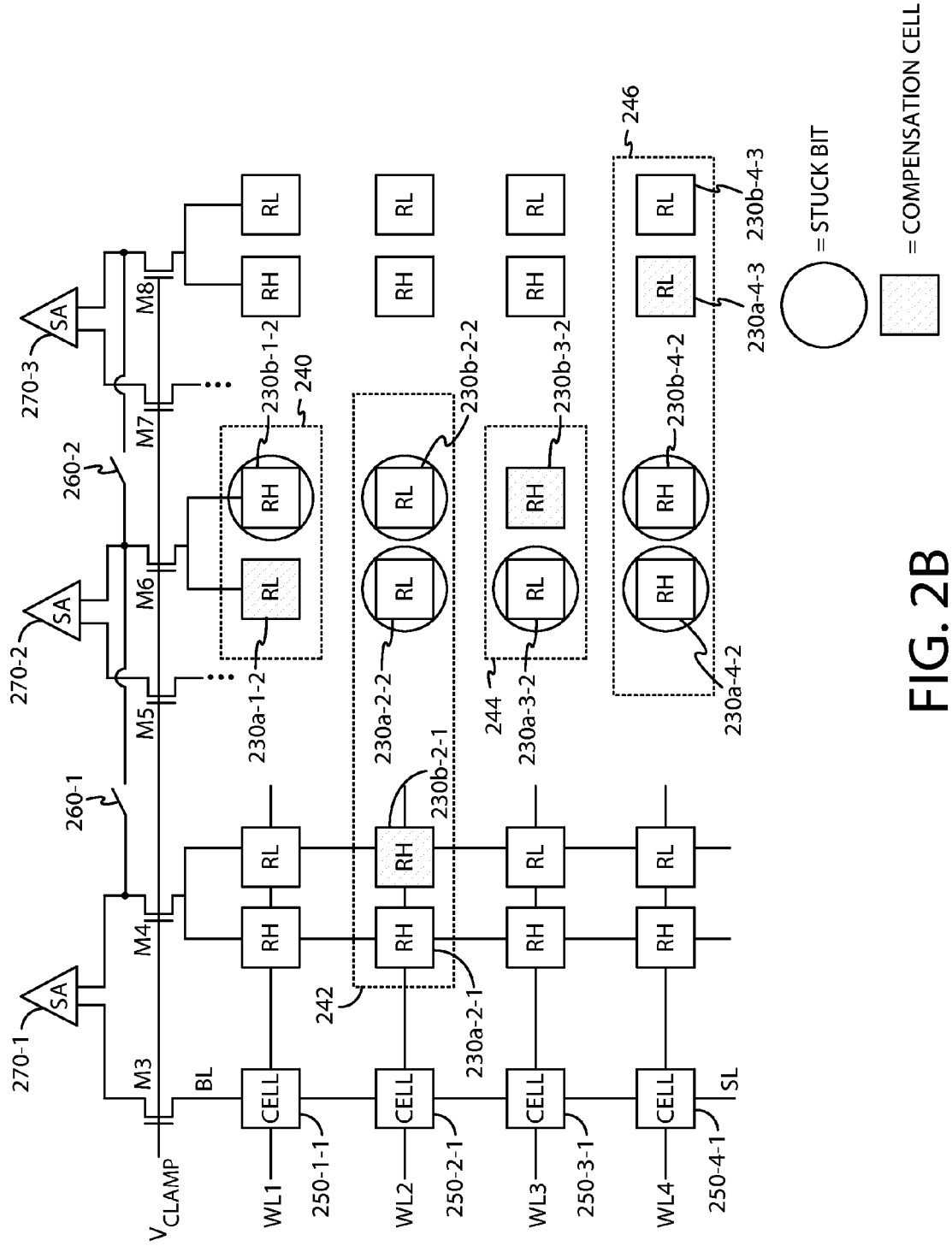
FIG. 2B is a an illustration of a reference cell patterning technique in accordance with some embodiments.

FIG. 2B is a an illustration of a reference cell patterning technique in accordance with some embodiments. As shown in FIG. 2B, "compensation cells," which are reference cells that are not stuck, are written with values that effectively compensate for a stuck bit in the same row. The compensation cells would not ordinarily be written with these values (see FIG. 2A) if these compensation cells were not used for compensating stuck bits. Compensation cells are shown with diagonal striping in FIG. 2B. At the first row (top row in FIG. 2B), a stuck bit $R_H$ at reference cell 230b-1-2 is detected by reading the state of that cell and determining that the state is $R_H$ instead of $R_L$ as desired by the pattern shown in the first column of FIG. 2A. $R_L$ is written into compensation cell 230a-1-2 to compensate for the stuck bit at cell 230b-1-2. In other words, a write operation is initiated at cell 230a-1-2 to change the state of that cell (from $R_H$ to $R_L$, in this example). Because there are now one $R_L$ cell and one $R_H$ cell in reference pair 240, these two reference cells may be merged to yield a reference current that is the same as if cell 230a-1-2 had been written (as originally desired) to $R_H$ and cell 230b-1-2 had been written to $R_L$.

At the second row, both cells in the second column (cells 230a-2-2 and 230b-2-2) are stuck at $R_L$, so the technique described above (for pair reference 240) is insufficient. In this case, cells 230a-2-2 and 230b-2-2 are grouped with cells 230a-2-1 and 230b-2-1 that are in the same row, and cell 230b-2-1 (which would normally be written to $R_L$) is written to $R_H$ to compensate for a stuck $R_L$ at the second column. Thus, cell 230b-2-1 is a compensation cell. Cell 230a-2-1 is also written to $R_H$ (as it would ordinarily be written, see FIG. 2A). The cells in group 242 (including two $R_H$ cells and two $R_L$ cells) are merged to yield the correct reference current.

Similarly, at the third row, $R_H$ is written into compensation cell 230b-3-2 so that reference pair 244 yields the correct reference current, and at the fourth row, $R_L$ is written into compensation cell 230a-4-3 so that group 246 yields the correct reference current when the cells in that group are merged. In some embodiments, to compensate for a stuck bit at a given column of a given row, a compensation cell from an adjacent column in the same row is used; in other embodiments, a compensation cell from a non-adjacent column in the same row is used. Although two reference pairs are shown grouped together in group 246, more than two reference pairs can be grouped together as well.

FIG. 2B also shows word lines and how various reference cells are merged to provide the indicated groupings. The rows in FIG. 2B are associated with word lines WL1, ..., WL4. Operational cells 250-1-1, 250-2-1, 250-3-1, and 250-4-1 are shown in the first column; similar operational cells are present in the other columns but are not shown, for graphical convenience. Similarly, the word lines are not shown as extending across all the columns for graphical convenience. At the first column, transistor M3 is coupled to an operational cell depending on the selected word line, and transistor M4 is coupled to a reference pair. A sense amplifier 270-1 compares a cell current from an operational cell against a reference current from a reference pair. Similar transistors M5, M6, M7, M8 and sense amplifiers 270-2, 270-3 are provided at the other columns as shown in FIG. 2B. Thus, each column is associated with a respective I/O device. A clamp voltage $V_{CLAMP}$ drives transistors M3, ..., M8. Switches 260-1 and 260-2, which may be implemented as transistors, transmission gates, or any other type of switch, enable reference cells to be merged to provide groupings 242 and 246, for example. For example, switch 260-1 may be closed and switch 260-2 may be opened to implement grouping 242. By this merging technique, sense amplifier inputs corresponding to various reference cells (reference cells in various columns) may be coupled together.

Figure 1C:
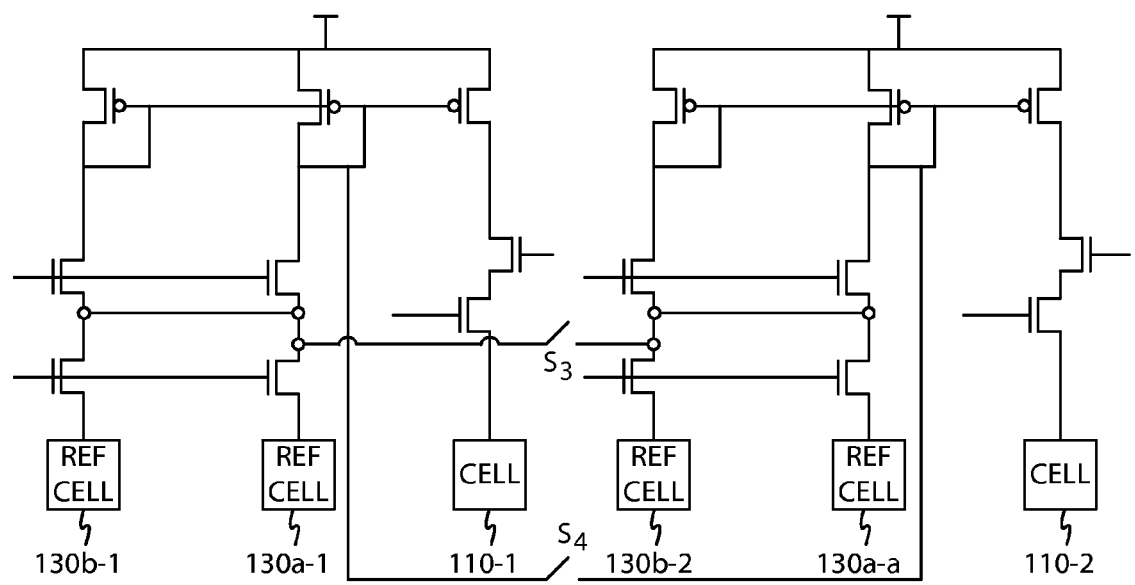
FIG. 1C is a circuit diagram showing a technique for grouping cells in accordance with some embodiments.

FIG. 1C is a circuit diagram showing a technique for merging/grouping cells in accordance with some embodiments. Closing switch S3 merges the pair of reference cells 130a-1, 130b-1 in a first column with the pair of reference cells 130a-2, 130b-2 in a second column. Each of switches 260-1 and 260-2 in FIG. 2B serves the role of switch S3. FIG. 1C shows an additional switch S4 which is not shown in FIG. 2B. Current mirrors from respective columns are coupled together when switch S4 is closed. Thus, in various embodiments, bit lines may be merged and/or current mirrors may be merged.

In general, various numbers of compensation cells (may be used to trim a reference current level upwards or downwards. Suppose that before trimming, the reference current level is specified by: $A=(I\_RH_0+ \ldots +I\_RH_n+I\_RL_0+ \ldots +I\_RL_n)/2n$, where n is the number of I/O devices. After trimming, the reference current level may be specified by: $B= (I\_RH_0+ \ldots +I\_RH_{n-k}+I\_RL_0+ \ldots +I\_RL_{n+k})/2n$, where n is the number of I/O devices and k is an integer trimming factor.

Figure 2C:
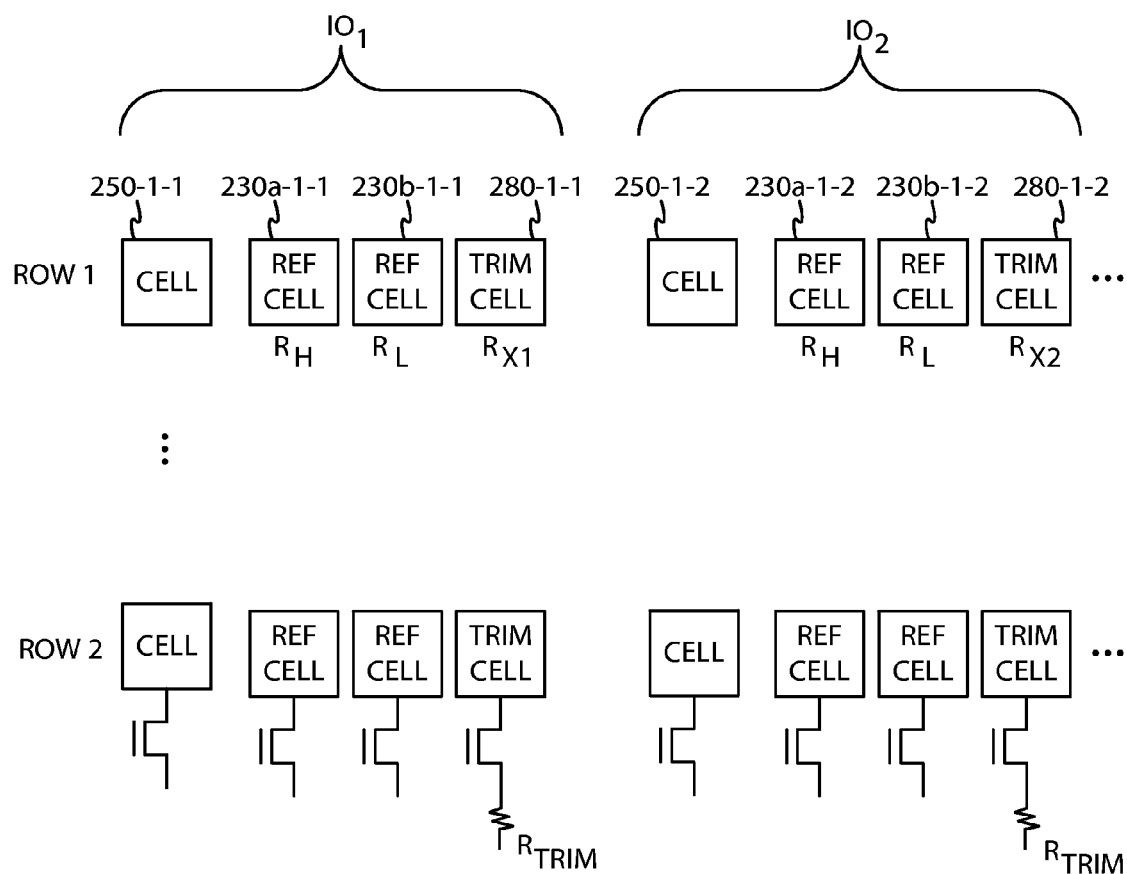
FIG. 2C is a diagram in accordance with some embodiments using an additional set of reference trimming cells.

FIG. 2C is a diagram in accordance with some embodiments using an additional set of reference trimming cells. A reference trimming cell is associated with each operational bit cell. For example, reference trimming cell 280-1-2 is associated with operational cell 250-1-2 and is at the first row and second column. Each reference trimming cell may be set to either $R_H$ or $R_L$ and is selectively coupled (e.g., via a transistor) to a resistor having resistance $R_{TRIM}$ as shown in FIG. 2C. In the example of FIG. 2C, reference cells 230a-1-1, 230b-1-1, 230a-1-2, and 230b-1-2 have resistances $R_H$, $R_L$, $R_H$, and $R_L$, respectively, and trim cells 280-1-1 and 280-1-2 have resistances $R_{X1}$ and $R_{X2}$, respectively. The current for cells 230a-1-1 and 230a-1-2 in this example is $I_{RH}=VBL/R_H$, and the current for cells 230b-1-1 and 230b-1-2 is $I_{RL}=VBL/R_L$, where VBL is the bit line voltage for a read operation. It follows that the reference current of columns IO1 and IO2 (with each column corresponding to a respective I/O device, for example) is given by $I_{WITH-TRIM}=[2*VBL/R_H+2*VBL/R_L+VBL/(R_{X1}+R_{TRIM})+VBL/(R_{X2}+R_{TRIM})]/2$.

Consider the original current if trim cells 280-1-1 and 280-1-2 were not used. This original current would be $I_{NO-TRIM}=2*VBL/R_H+2*VBL/R_L$. If $I_{NO-TRIM}$ is too close to $I_{RL}$ (i.e., too large), $R_{X1}$ and $R_{X2}$ can be set equal to $R_H$ to reduce the reference current (after merging). On the other hand, if $I_{NO-TRIM}$ is too close to $I_{RH}$ (i.e., too small), $R_{X1}$ and $R_{X2}$ can be set equal to $R_L$ to increase the reference current (after merging).

By merging a reference pair (pair of reference cells) with a reference trimming cell, additional flexibility (finer resolution) for adjusting the reference current level is obtained. Compensation cells and groupings may be used as in FIG. 2B (e.g., for one row or for every row), such that the technique shown in FIG. 2C provides extended capabilities compared to the technique shown in FIG. 2B.

In various embodiments, trimming (e.g., by varying a bit line reference voltage or a sensing ratio, or pattern-based trimming such as in FIGS. 2B-2C) occurs at a testing stage, e.g., when an MRAM system is tested before tapeout or final packaging. Trimming may be implemented by blowing fuses or by using extra memory array storage (e.g., extra transistors) to store the trimming information.

Various embodiments of the present disclosure enable negative effects associated with process variation in MRAM components to be mitigated, e.g., by compensating for stuck or incorrectly written reference bits. The same read margin can thus be obtained for reading either state ("0" or "1") to improve the read yield, and improve reliability of read operations, for MRAM systems.

Figure 3:
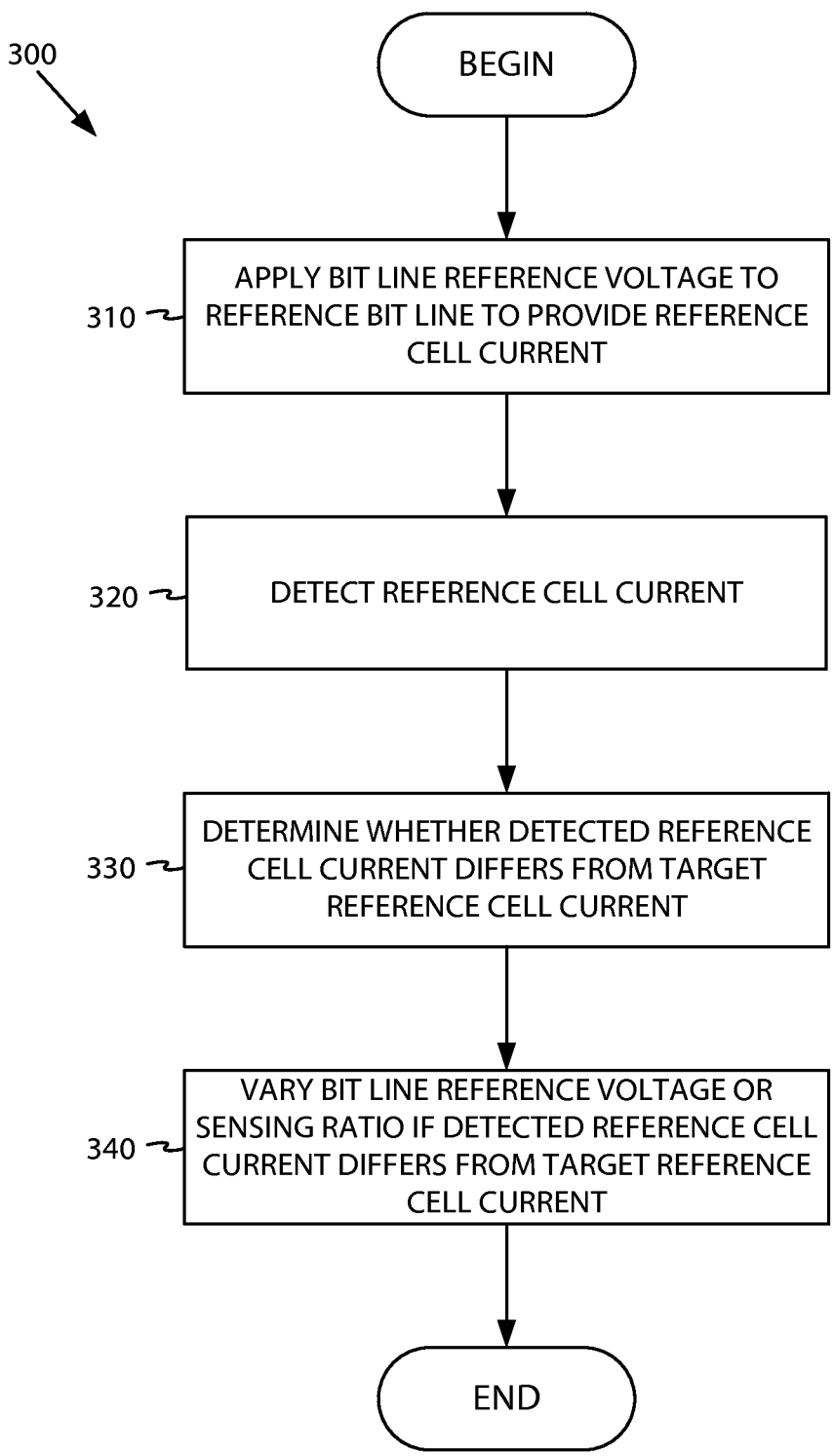
FIG. 3 is a flow diagram of a process in accordance with some embodiments.

FIG. 3 is a flow diagram of a trimming process in accordance with some embodiments. Process 300 is for setting a reference current used in operating an MRAM module comprising an operational MRAM cell (e.g., cell 110) coupled to a bit line (e.g., BL), multiple reference MRAM cells (e.g., reference cells 130a, 130b) coupled to a reference bit line (e.g., RBL), and a sense amplifier (e.g., sense amplifier 140) coupled to the bit line and the reference bit line. The process includes applying a bit line reference voltage (block 310) to the reference bit line to provide a reference cell current (e.g., $I_{REF}$) formed by a sum of respective currents through the plurality of reference MRAM cells. The reference cell current is detected (block 320). A determination is made as to whether the detected reference cell current differs from a target reference cell current (block 330). The bit line reference voltage is varied, or a sensing ratio of the sense amplifier is varied, if it is determined that the detected reference cell current differs from the target reference cell current (block 340).

Figure 4:
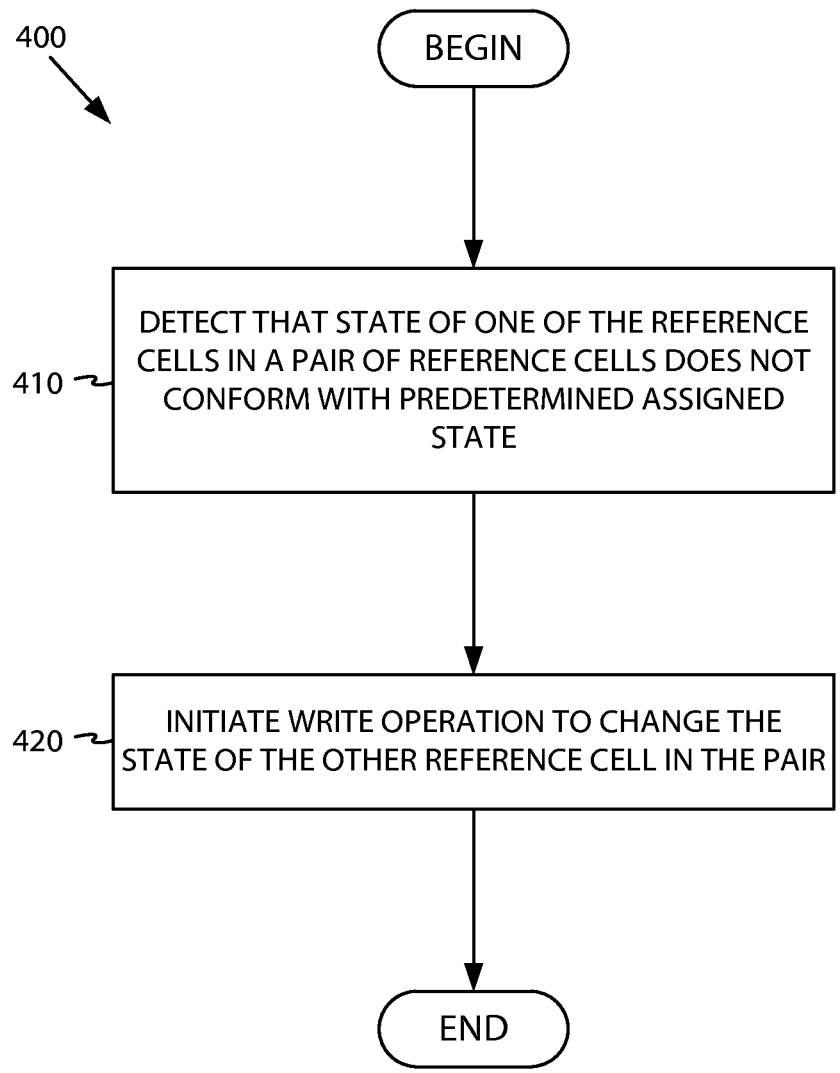
FIG. 4 is a flow diagram of another process in accordance with some embodiments.

FIG. 4 is a flow diagram of a process in accordance with some embodiments. Process 400 is performed with a magneto-resistive random access memory (MRAM) including pairs of reference MRAM cells arranged in an array of rows and columns. A state of one of the reference cells (e.g., cell 230b-1-2) in a pair of reference cells (e.g., pair 240) is detected (block 410) as not conforming with a predetermined assigned state. A write operation is initiated (block 420) to change the state of the other reference cell (e.g., cell 230a-1-2) in the first pair.

Figure 5:
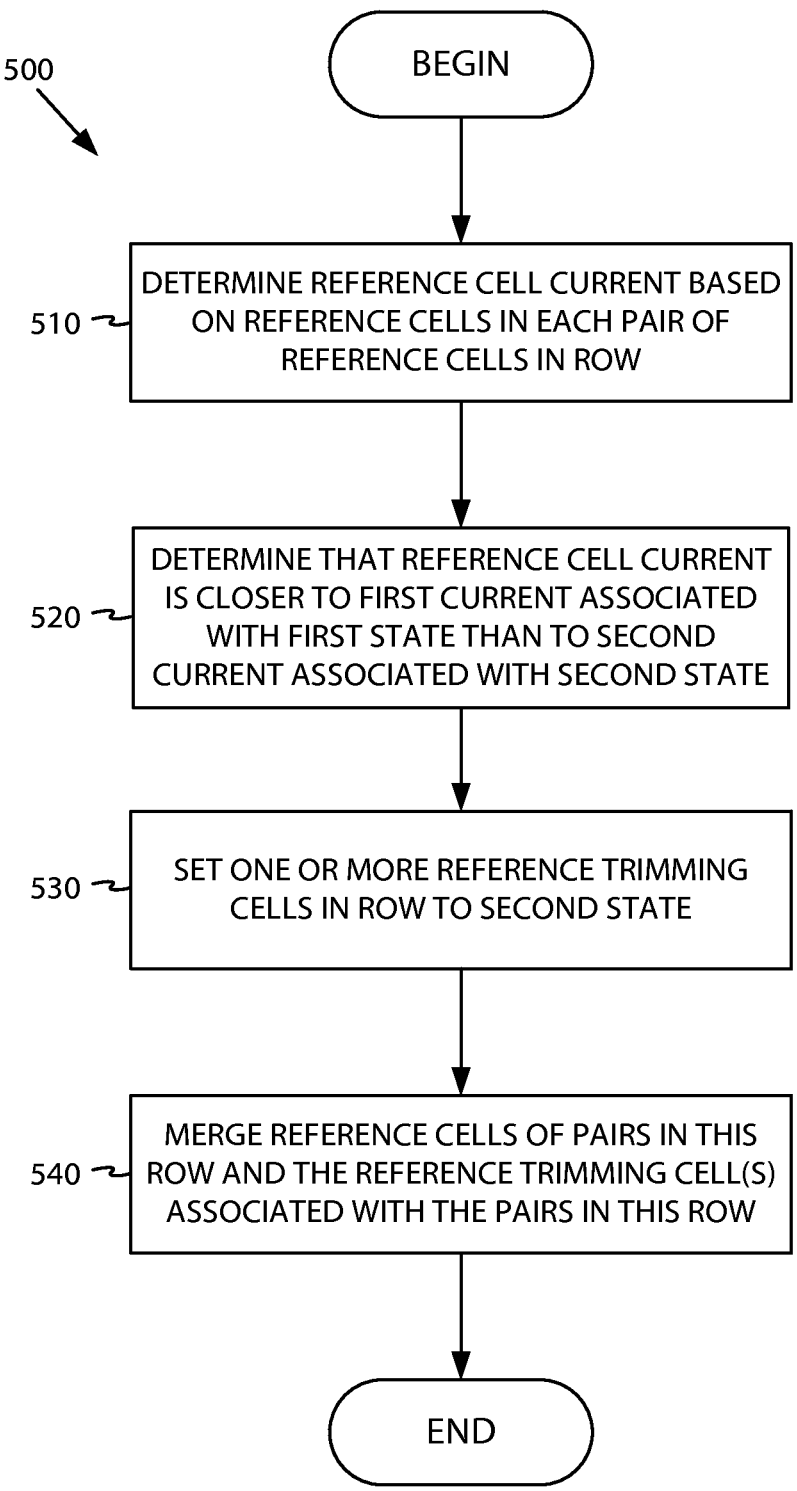
FIG. 5 is a flow diagram of another process in accordance with some embodiments.

FIG. 5 is a flow diagram of a process in accordance with some embodiments. Process 500 is performed with a magneto-resistive random access memory (MRAM). The memory includes pairs of reference MRAM cells arranged in an array of rows and columns, and reference trimming cells associated with respective pairs of reference cells. Each cell is capable of being set to a first state or a second state corresponding to first and second resistances, respectively (e.g., RL and RH). For at least one row, processing corresponding to blocks 510, 520, 530, 540 is performed. A reference cell current is determined (510) based on the reference cells in each pair in this row (the at least one row). A determination is made that the reference cell current is closer to a first current (e.g., I_RL) associated with the first state than to a second current (e.g., I_RH) associated with the second state (block 520). One or more reference trimming cells in said row are set to the second state (block 530). The reference cells of the pairs of this row and the reference trimming cell(s) associated with the pairs of this row are merged (block 540).

Some embodiments include a trimming process for setting a reference current used in operating an MRAM module comprising an operational MRAM cell (e.g., cell 110) coupled to a bit line (e.g., BL), multiple reference MRAM cells (e.g., reference cells 130a, 130b) coupled to a reference bit line (e.g., RBL), and a sense amplifier (e.g., sense amplifier 140) coupled to the bit line and the reference bit line. The process includes applying a bit line reference voltage to the reference bit line to provide a reference cell current (e.g., $I_{REF}$) formed by a sum of respective currents through the plurality of reference MRAM cells. The reference cell current is detected. A determination is made as to whether the detected reference cell current differs from a target reference cell current. The bit line reference voltage is varied, or a sensing ratio of the sense amplifier is varied, if it is determined that the detected reference cell current differs from the target reference cell current.

Some embodiments include a process performed with a magneto-resistive random access memory (MRAM) including pairs of reference MRAM cells arranged in an array of rows and columns. A state of one of the reference cells (e.g., cell 230b-1-2) in a pair of reference cells (e.g., pair 240) is detected as not conforming with a predetermined assigned state. A write operation is initiated to change the state of the other reference cell (e.g., cell 230a-1-2) in the first pair.

Some embodiments include a process performed with a magneto-resistive random access memory (MRAM). The memory includes pairs of reference MRAM cells arranged in an array of rows and columns, and reference trimming cells associated with respective pairs of reference cells. Each cell is capable of being set to a first state or a second state corresponding to first and second resistances, respectively (e.g., RL and RH). For at least one row, various processing takes place. A reference cell current is determined based on the reference cells in each pair in this row (the at least one row). A determination is made that the reference cell current is closer to a first current (e.g., I_RL) associated with the first state than to a second current (e.g., I_RH) associated with the second state. One or more reference trimming cells in said row are set to the second state. The reference cells of the pairs of this row and the reference trimming cell(s) associated with the pairs of this row are merged.

In some embodiments, a memory apparatus includes multiple operational magneto-resistive random access memory (MRAM) cells (e.g., cells 250-1-1, 250-2-1, etc.) arranged in an array of rows and columns, multiple pairs of reference MRAM cells (e.g., a pair including reference cells 230a-1-1 and 230b-1-1, another pair including reference cells 230a-2-1 and 230b-2-1, etc.) where each pair corresponds to a same row and column as a corresponding operational cell, multiple sense amplifiers (e.g., sense amplifiers 270-1, 270-2, etc.) associated with respective columns, and multiple word lines (e.g., word lines WL1, WL2, etc.) configured to select respective rows. A first subset of the pairs of reference cells conforms to a predetermined pattern assigning a first state to a first positional one, and a second state to a second positional one, of each pair of reference cells in the first subset. A pair not in the first subset (e.g., the pair including reference cells 230a-1-2- and 230b-1-2) does not conform to the predetermined pattern and includes a cell stuck at the first state (in this example, cell 230b-1-2 is stuck at $R_H$) and the other cell set in the second state (in this example, compensation cell 230a-1-2 is set in the $R_L$ state to compensate for the stuck cell 230b-1-2).

In some embodiments, a memory apparatus includes multiple operational magneto-resistive random access memory (MRAM) cells (e.g., cells 250-1-1, 250-2-1, etc.) arranged in an array of rows and columns, multiple pairs of reference MRAM cells (e.g., a pair including reference cells 230a-1-1 and 230b-1-1, another pair including reference cells 230a-2-1 and 230-b-2-1, etc.) where each pair corresponds to a same row and column as a corresponding operational cell, multiple sense amplifiers (e.g., sense amplifiers 270-1, 270-2, etc.) associated with respective columns, and multiple word lines (e.g., word lines WL1, WL2, etc.) configured to select respective rows. A first subset of the pairs of reference cells conforms to a predetermined pattern assigning a first state and a second state to the reference cells at a first position and a second position, respectively, of each pair in said first subset. A second subset of the pairs, disjoint form the first subset, includes a first pair and a second pair, the first pair including two reference cells stuck at the first state (e.g., reference cells 230-a-4-2 and 230b-4-2 that are stuck at $R_H$), the second pair including two reference cells in the second state (e.g., reference cells 230a-4-3 and 230b-4-3 that are in the $R_L$ state). The first and second pairs are merged together.

Although examples are illustrated and described herein, embodiments are nevertheless not limited to the details shown, since various modifications and structural changes may be made therein by those of ordinary skill within the scope and range of equivalents of the claims.

What is claimed is:

1. A trimming method for setting a reference current used in operating a magneto-resistive random access memory (MRAM) module comprising a first MRAM cell coupled to a bit line, a plurality of reference MRAM cells coupled to a reference bit line, and a sense amplifier coupled to the bit line and the reference bit line, the method comprising:

applying a bit line reference voltage to the reference bit line to provide a reference cell current formed by a sum of respective currents through the plurality of reference MRAM cells;

detecting the reference cell current;

determining whether the detected reference cell current differs from a target reference cell current; and varying one of the bit line reference voltage and a sensing ratio of the sense amplifier if it is determined that the detected reference cell current differs from the target reference cell current.

2. The method of claim 1, wherein the bit line reference voltage is varied by varying a control reference voltage at a first input of a first amplifier configured to control a switch, wherein said switch is configured to selectively couple the reference bit line and the sense amplifier, and a second input of said first amplifier is coupled to the reference bit line.

3. The method of claim 2, wherein the MRAM module is among a plurality of said MRAM modules, each MRAM module associated with a respective input/output (I/O) device, and the respective first inputs of the first amplifiers of the respective MRAM modules are electrically coupled together.

4. The method of claim 2, wherein the MRAM module is a first MRAM module among a plurality of said MRAM modules, each MRAM module associated with a respective input/output (I/O) device, and the reference voltage at the first input of the first amplifier of the first MRAM module is varied independent of the reference voltage at the first input of the first amplifier of another MRAM module in said plurality of MRAM modules.

5. The method of claim 1, wherein determining that the detected reference cell current differs from the target reference cell current includes determining a ratio between the detected reference cell current and the target reference cell current as being M:1, and the sensing ratio is multiplied by a factor of M.

6. The method of claim 5, wherein the MRAM module is among a plurality of said MRAM modules, each MRAM module associated with a respective input/output (I/O) device, and sensing ratios of the sense amplifiers of the respective MRAM modules are varied by the same factor.

7. The method of claim 5, wherein the MRAM module is a first MRAM module among a plurality of said MRAM modules, each MRAM module associated with a respective input/output (I/O) device, and the sensing ratio of the sense amplifier of the first MRAM module is varied independent of the sensing ratio of the sense amplifier of another MRAM module in said plurality of MRAM modules.

8. A method performed with a magneto-resistive random access memory (MRAM), the memory comprising a plurality of pairs of reference MRAM cells arranged in an array of rows and columns, the method comprising:

detecting that a state of one of the reference cells in a first pair of reference cells does not conform with a predetermined assigned state, and initiating a write operation to change the state of the other reference cell in the first pair.

9. The method of claim 8, wherein the state of said one reference cell is detected as being a first state, the method further comprising:

detecting that said other reference cell in the first pair is stuck in the first state;

initiating a write operation to write a second state into one of the reference cells of a second pair of reference cells in the same row as the first pair; and merging the reference cells of the first and second pairs.

10. The method of claim 9, wherein the other reference cell of the second pair was previously set to the second state.

11. The method of claim 9, wherein the first and second pairs are in adjacent columns.

12. The method of claim 9, wherein the memory further comprises a plurality of reference trimming cells associated with respective pairs of reference cells, the method further comprising:

setting the reference trimming cells associated with the first and second pairs to values compensating for currents at the reference cells of the first and second pairs; and merging, with the reference cells of the first and second pairs, the reference trimming cells associated with the first and second pairs.

13. The method of claim 8, wherein the memory further comprises a plurality of reference trimming cells associated with respective pairs of reference cells, the method further comprising:

setting the reference trimming cell associated with the first pair to a value compensating for currents at the reference cells of the first pair; and merging, with the reference cells of the first pair, the reference trimming cell associated with the first pair.

14. A method performed with a magneto-resistive random access memory (MRAM), the memory comprising a plurality of pairs of reference MRAM cells arranged in an array of rows and columns, and a plurality of reference trimming cells associated with respective pairs of reference cells, each cell capable of being set to a first state or a second state corresponding to first and second resistances, respectively, the method comprising:

for at least one row:

determining a reference cell current based on the reference cells in each pair in said row;

determining that said reference cell current is closer to a first current associated with the first state than to a second current associated with the second state;

setting one or more reference trimming cells in said row to the second state; and merging the reference cells of the pairs of said row and the one or more reference trimming cells associated with the pairs of said row.

15. The method of claim 14, wherein said one or more reference trimming cells in said row are set iteratively to the second state until a reference cell current based on the reference cells in each pair in said row and the reference trimming cells set to the second state is no longer closer to the first current than to the second current.

16. The method of claim 14, wherein the method is performed for each row of said array.

17. The method of claim 14, wherein if the reference cell current is too low, the one or more reference trimming cells is set to a low resistance state to increase the reference cell current after said merging, and if the reference cell current is too high, the one or more reference trimming cells is set to a high resistance sate to decrease the reference cell current after said merging.

18. The method of claim 14, wherein said merging step is performed during a testing stage.

19. The method of claim 14, wherein the merging step includes the step of blowing at least one fuse.

20. The method of claim 14, wherein the merging step further comprises using a memory for storing trimming information.

\* \* \* \* \*